(12) United States Patent
Lee

(10) Patent No.: US 6,839,239 B1
(45) Date of Patent: Jan. 4, 2005

(54) ELECTRONIC DEVICE PACKAGING

(75) Inventor: Seang Wee Lee, Sunnyvale, CA (US)

(73) Assignee: 3Com Corporation, Santa Clara, CA (US)

( * ) Notice: Subject to any disclaimer, the term of this patent is extended or adjusted under 35 U.S.C. 154(b) by 53 days.

(21) Appl. No.: 10/198,218

(22) Filed: Jul. 17, 2002

(51) Int. Cl.⁷ .................................................. H05K 5/06
(52) U.S. Cl. ........................ 361/752; 361/740; 361/759; 206/308; 206/310
(58) Field of Search ................................. 361/752, 801, 361/759, 747, 726, 740; 206/308, 310, 309

(56) References Cited

U.S. PATENT DOCUMENTS

| | | | |
|---|---|---|---|
| 4,793,479 A | * | 12/1988 | Otsuka et al. ............ 206/308.1 |
| 5,207,717 A | * | 5/1993 | Manning ................... 206/232 |
| 5,363,956 A | * | 11/1994 | Taniyama .................. 206/312 |
| 5,400,902 A | * | 3/1995 | Kaminski ................... 206/310 |
| 5,857,573 A | * | 1/1999 | Pakeriasamy ............... 206/723 |
| 6,237,763 B1 | * | 5/2001 | Lau ......................... 206/308.1 |
| 6,320,759 B1 | * | 11/2001 | Tusan et al. ............... 361/801 |
| 6,604,635 B1 | * | 8/2003 | Kutaragi et al. ............. 206/579 |

* cited by examiner

*Primary Examiner*—Kamand Cuneo
*Assistant Examiner*—Hung Bui

(57) ABSTRACT

The present invention discloses a large form factor media enclosure structure configured to removably retain a smaller form factor device therein. The large form factor media enclosure structure includes a first flexible retainer, and a second retainer oppositely disposed from said first retainer. A catch paw is disposed along the first retainer, for frictionally engaging the smaller form factor device.

25 Claims, 13 Drawing Sheets

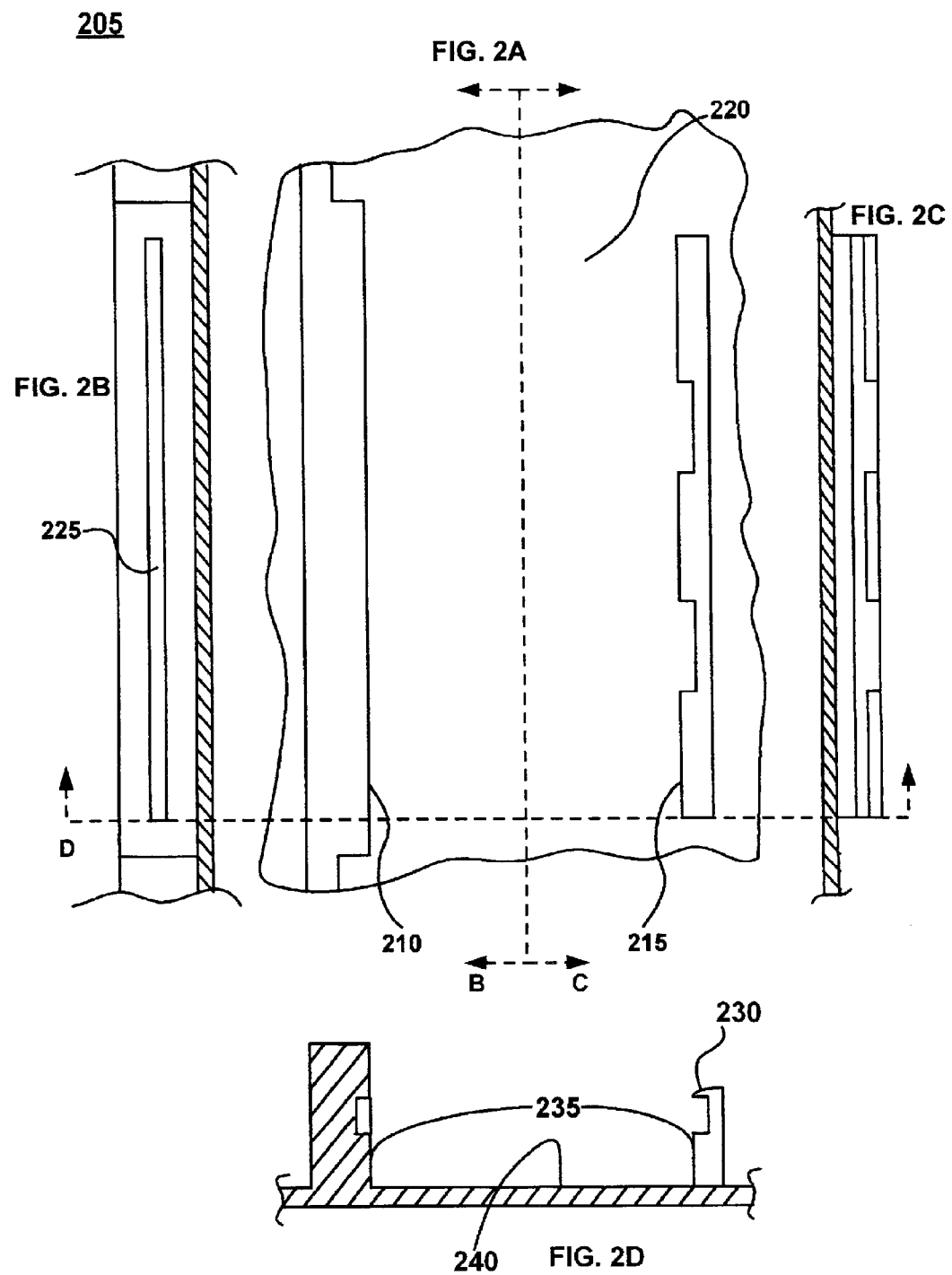

ELECTRONIC DEVICE PACKAGING

FIELD OF THE INVENTION

Embodiments of the present invention relate to packaging, and more particularly to packaging for PC cards, flash memory cards, memory sticks, and other like electronic devices.

BACKGROUND OF THE INVENTION

PC cards have become a popular standardized configuration for many electronic devices. There are currently at least three types of PC cards: Type I, Type II, and Type III. Each type is typically 54 mm wide and 85.6 mm long. Type I PC card are 3.3 mm high; Type II PC cards are 5.5 mm high; and Type III PC cards are 10.5 mm high. Typical Type I devices include ROM and RAM memory cards. Modems typically use the Type II configuration. While Type III devices include such things as disk drives and other large electronic devices. The sides of all three types of PC card have an edge thickness of 3.3 mm, corresponding to the Type I standard. Furthermore, the width of 54 mm is consistent for each type of PC card. However, the length and overall height can vary beyond the standard dimensions, in various commercial products.

Typically, PC cards and other like electronic devices are packaged for shipment to protect the device from damage. Furthermore, such electronic devices typically are shipped with an installation CD and associated documentation.

In the conventional art, the PC card, installation CD, and documentation are packaged in a cardboard box. The cardboard box is typically provided with cardboard dividers to provide separate compartments; one compartment for the PC card, and another for the CD and associated documentation. Furthermore, the various pieces of the documentation are usually shrink-rapped together, with another piece of cardboard so that the documentation is not bent or curled when the plastic is shrunk. Such a subassembly typically requires a label for inventory storage, inventory management, and/or kiting identification. The CD is also usually provided with a sleeve to protect it from damage by rubbing against other objects in the packaging. The box also typically has printed matter, such as product description and artwork, printed on or adhered to it.

Such packaging, according to the convention art, is typically specific to a particular product and even a particular model of a product. For example, if there are a number of models with varying dimensions, separate packaging material maybe required for each model in order to provide adequate product protection.

The packaging may also be comprised of a number of subassemblies. For example, the packaging may comprise an outer box and interior dividers. The installation CD and its associated sleeve and label may also comprise a subassembly. The documentation, cardboard filler, shrink rapping and label may comprise another subassembly. Each subassembly increases the kiting costs, storage costs, inventory management costs, and the like.

The packaging is also typically voluminous. For example, the cardboard thickness must be sufficient to hold the product and protect it from damage. The addition of dividers also adds to the volume of the product and increases the storage, shipping, and like costs.

Furthermore, if a particular feature of the product or model changes, some or all of the packaging must be scrapped because it is specific to the particular features of a given product or model. For example, the outside packaging will typically have printed matter on it. Therefore, any changes to the product which necessitate new printed matter will result in the existing packaging material needing to be scrapped.

Thus there is a continued need for an improved packaging for PC cards, flash memory cards, memory sticks, and the like devices.

SUMMARY OF THE INVENTION

The present invention provides a package having good protective qualities with relationship to the PC card or other like electronic device, the CD, and the associated documentation. The present invention also provides for reduction of packaging costs. The present invention also accommodates a number of different models and or products. The present invention also reduces the number of subassemblies. The present invention also provides for reduction of packaging volume. Furthermore, the present invention reduces or eliminates the need to scrap packaging material in the event of changes to the product.

In one embodiment, the present invention provides a large form factor media enclosure structure configured to removably retain a smaller form factor device therein. The large form factor media enclosure structure includes a first flexible retainer, and a second retainer oppositely disposed from said first retainer. A catch paw is disposed along the first retainer, for frictionally engaging the smaller form factor device.

BRIEF DESCRIPTION OF THE DRAWINGS

The present invention is illustrated by way of example and not by way of limitation, in the figures of the accompanying drawings and in which like reference numerals refer to similar elements and in which:

FIGS. 2A–2D show a top view and side sectional views, respectively, of a large form factor media enclosure structure in accordance with one embodiment of the present invention.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1:
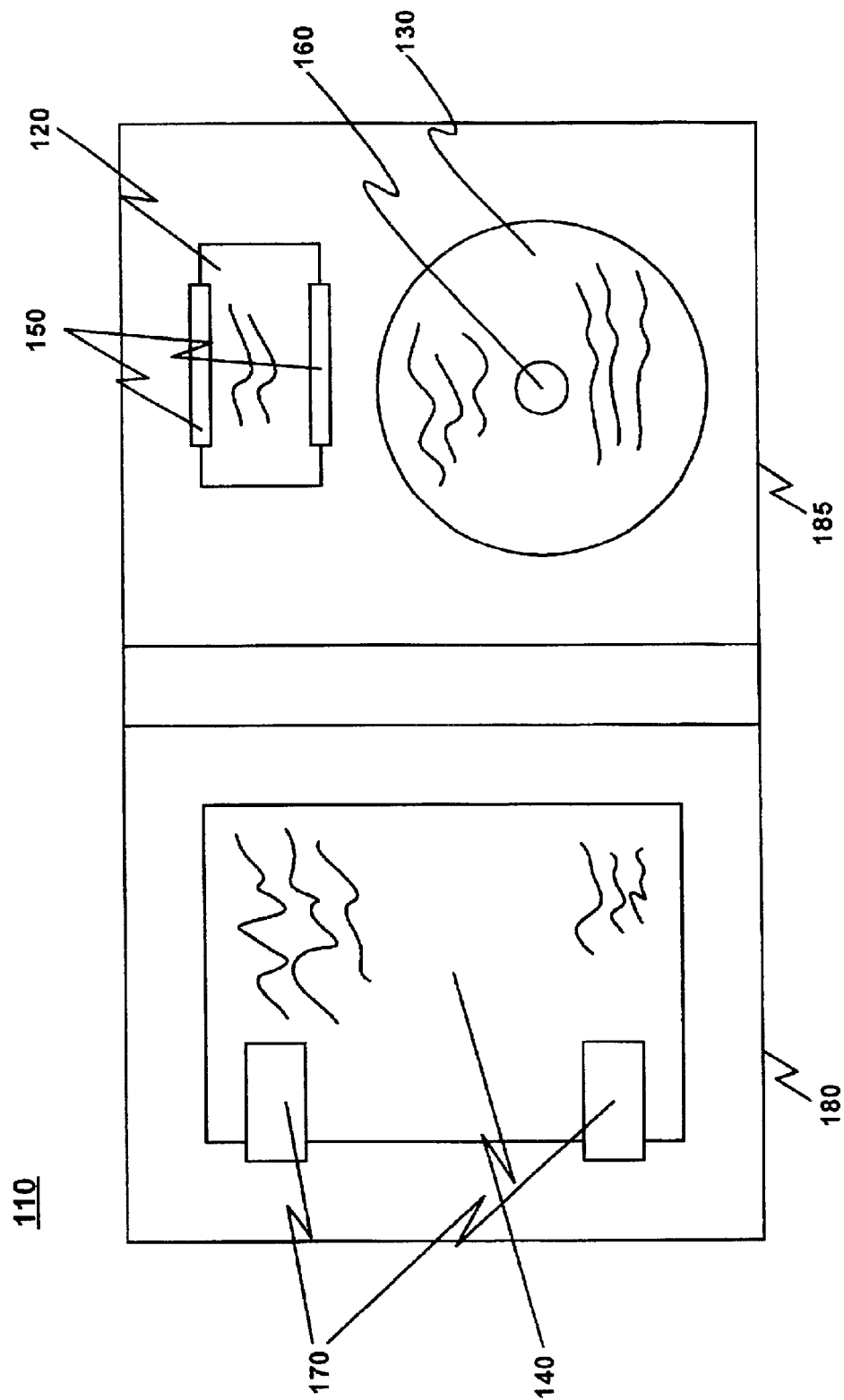
FIG. 1 shows a plain view of a package in accordance with one embodiment of the present invention.

Referring to FIG. 1, a plain view of a package in accordance with one embodiment of the present invention is shown. As depicted in FIG. 1, the package 110 provides a holder 150 for a PC card, flash memory card, memory stick, or like electronic device 120 (herein referred to as a PC card). Additionally, the package 110 may also provide a holder 160 for a compact disc or like data carrier 130 (hereinafter referred to as a CD) and/or a holder 170 for associated documentation 140.

In one embodiment, the present invention provides a PC card holder 150 along the inside of the top or bottom cover 180, 185. In another embodiment, the present invention provides a PC card holder 150 and CD holder 160 along the inside of the top or bottom cover 180, 185. In another embodiment, the present invention provides a PC card holder 150 and an associated documentation holder 170 along the inside of the top or bottom cover 180, 185. In yet another embodiment, the present invention provides a PC card holder 150, a CD holder 160, and an associated documentation holder 170 along the inside of the top or bottom cover 180, 185. In an exemplary embodiment, as illustrated in FIG. 1, the PC car holder 150 and CD holder 160 are provided adjacent each other on the inside of the bottom cover 185, while the associated documentation holder 170 is provided on the inside of the top cover 180.

In one embodiment, the present invention holds a PC card 120 utilizing a pair of retainers 150 disposed along two opposite edges of the PC card 120. In one implementation, the PC card 120 is inserted or extracted by pressing or pulling the PC card 120 into or out from between the pair of retainers 150. In another implementation, one or both retainers 150 are provided with a release mechanism to facilitate insertion and extraction of the PC card 120 from between the retainers 150.

In one embodiment, the present invention holds a CD 130 utilizing a retainer 160 disposed within the interior opening of the CD. In one implementation, the CD 130 is inserted or extracted by pressing or pulling on the CD 130 onto or off of the retainer 160. In another implementation, the retainer 160 is provided with a release mechanism to facilitate insertion and extraction of the CD 130 from the retainer 160.

In one embodiment, the present invention holds associated documentation 140 utilizing one or more retainers 170. In one implementation, the retainer 170 holds the associated document 140 utilizing frictional force. In another implementation, the retainer 170 holds the associated document 140 utilizing a pocket.

Referring to FIGS. 2A–2D, a top view and side sectional views, respectively, of a large form factor media enclosure structure 205 in accordance with one embodiment of the present invention are shown. As depicted in FIGS. 2A–2D, the large form factor media enclosure structure 205 provides an area 220 for holding a amaller form factor device. The large form factor media enclosure structure 205 includes a fixed retainer 210 and a flexible retainer 215. The fixed retainer 215 provides a slot 225 for accepting an edge of the smaller form factor device. The flexible retainer 215 provides one or more catch paws 230 for engaging an edge of the smaller form factor device. The fixed retainer 210 and flexible retainer 215 are disposed opposite each other at a distance slightly greater than the width or length of the smaller form factor device. The catch paws 230 are located on the flexible retainer 215 at a height slightly greater then the edge height of the smaller form factor device.

Therefore, one implementation of the present invention can be used for holding multiple types of smaller form factor devices. Such an implementation is capable of accepting smaller form factor devices of varying lengths or widths, because the widthwise or lengthwise direction, respectively, of the smaller form factor devices are not obstructed by any retainer 210 215. Furthermore, if the smaller form factor devices have the same edge height, the same implementation is capable of accepting smaller form factor devices of varying overall heights because the catch paws 230 and slot 225 engage the smaller form factor devices along the edges of the smaller form factor devices.

In one embodiment of the present invention, the large form factor media enclosure structure 205 is also provided with spacers 235. The spacers 235 hold the smaller form factor device away from a base 240 of the large form factor media enclosure structure 205. Thus, the spacers 235 provide additional protection for the smaller form factor device by spacing the smaller form factor device away from the base 240 of the large form factor media enclosure structure 205. The large form factor media enclosure structure 205 with spacers 235 can also be utilized for smaller form factor devices having heights that vary above and/or below the edges of the smaller form factor devices.

In one embodiment of the present invention, the smaller form factor device can be inserted and removed by pressing or pulling on the smaller form factor device with sufficient force to cause the flexible retainer 215 to flex such that the catch paws 230 disengage or engage the edge of the smaller form factor device. The force necessary to insert and remove the smaller form factor device should be sufficiently large so that the product remains held under normal conditions, such as shipping and handling. However, the force necessary to insert and remove the smaller form factor device should not be so high as to cause damage to the smaller form factor device. In another embodiment of the present invention, a release mechanism can be provided for displacing the catch paws 230 for easier insertion and extraction of the smaller form factor device.

In an another implementation of the above-described embodiment, the fixed retainer provides a closed slot 225, for accepting an edge of the smaller form factor device. The slot 225 having closed ends provides additional retention of the smaller form factor device with respect to forces acting in a parallel direction to the lengthwise direction of the slot 225.

Figure 3A:
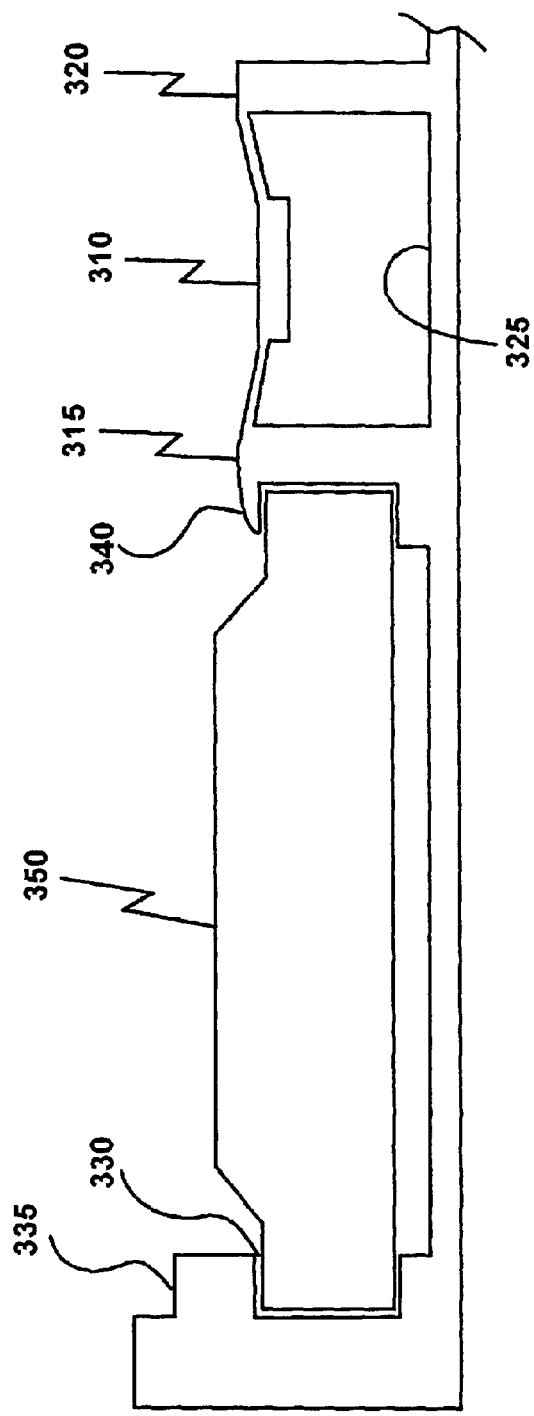
FIGS. 3A–3F show the operation of a release mechanism in accordance with one embodiment of the present invention.

Referring to FIGS. 3A–3F, operation of a release mechanism in accordance with one embodiment of the present invention is shown. As depicted in FIGS. 3A, the release 310 is coupled to a flexible retainer 315 and a flexible member 320. Both the flexible retainer 315 and flexible member 320 are anchored to a base 325 of the large form factor media enclosure structure. The edges of a smaller form factor device 350 are engaged by a slot 330 in a fixed retainer 335 and a catch paw 340 on the flexible retainer 315, when the release mechanism 310 is in the static state.

Figure 3B:
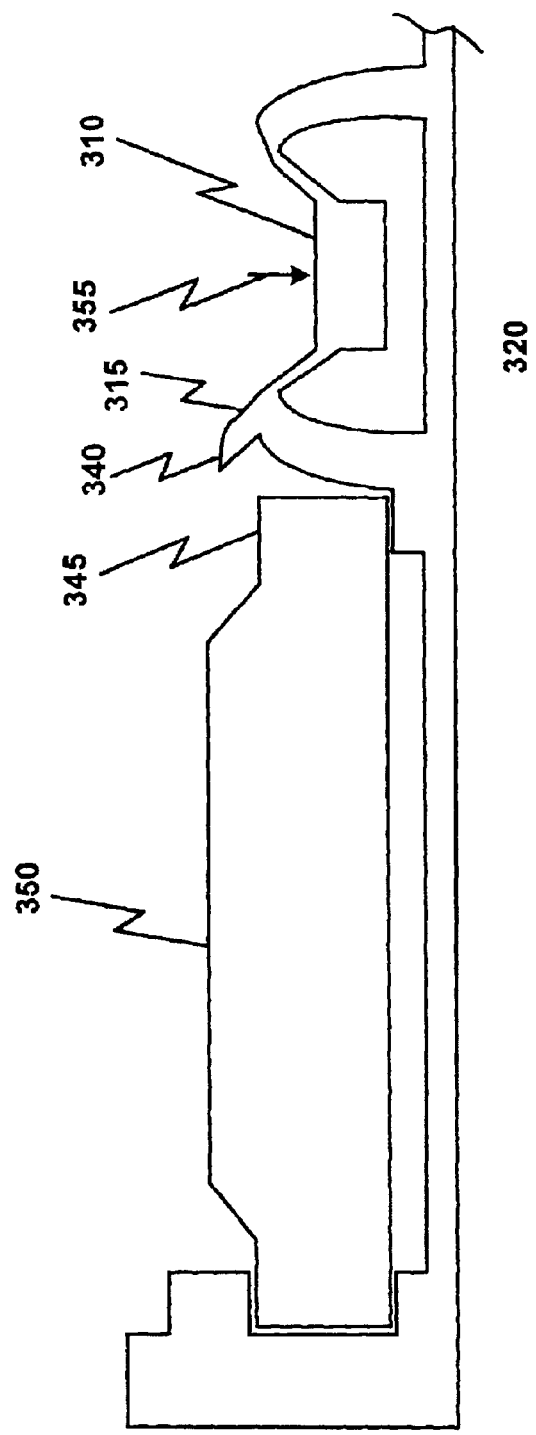

As shown in FIG. 3B, the release 310 acts to disengage the catch paw 340 from an edge 345 of the smaller form factor device 350. The release 310 is activated by a downward force 355, which causes the flexible retainer 315 to flex in toward the release 310. As the flexible retainer 315 bends in toward the release 310, the catch paw 340 is drawn away from the smaller form factor device 350, thereby releasing the smaller form factor device 350.

Figure 3C:
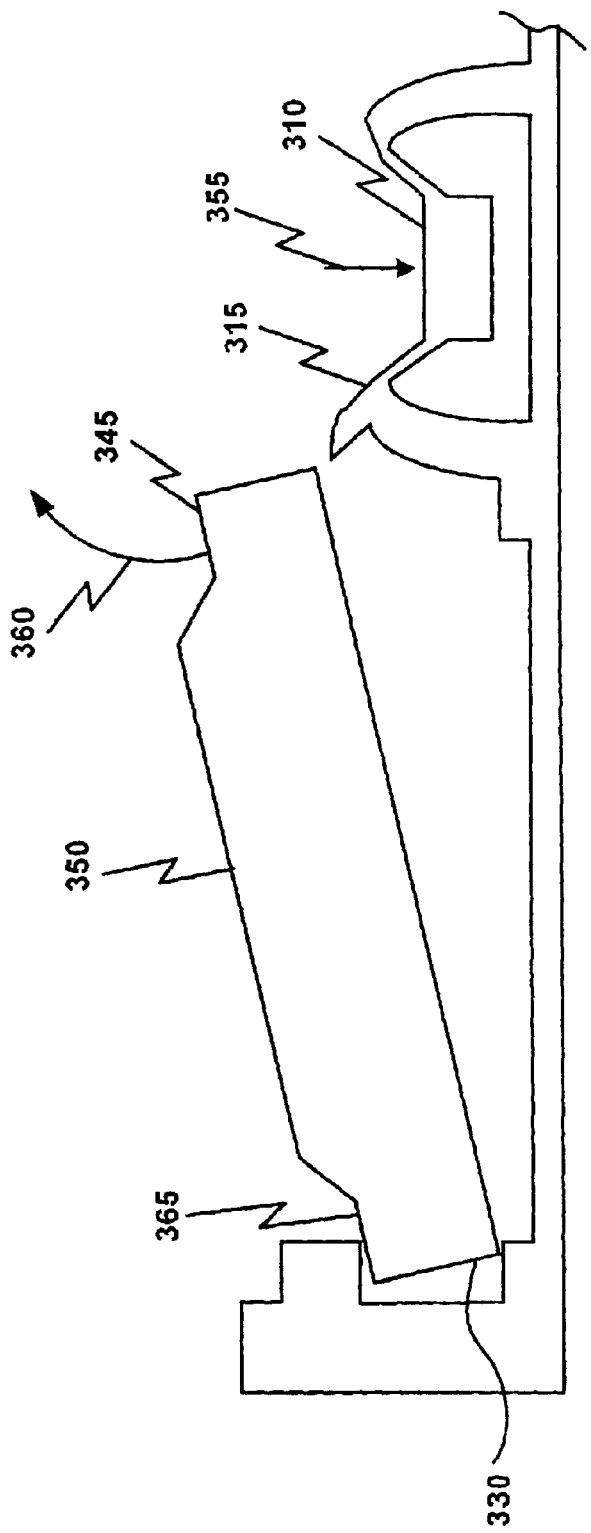

As shown in FIG. 3C, the smaller form factor device 350 is then extracted. The edge 345 of the smaller form factor device 355 adjacent the flexible retainer 315 is lifted up and slightly toward 360 the flexible retainer 315 such that the opposite edge 365 of the smaller form factor device is removed from the slot 330 in the fixed retainer 335. The force 355 on the release 310 mechanism can then be release once the smaller form factor device 350 has been extracted.

Figure 3D:
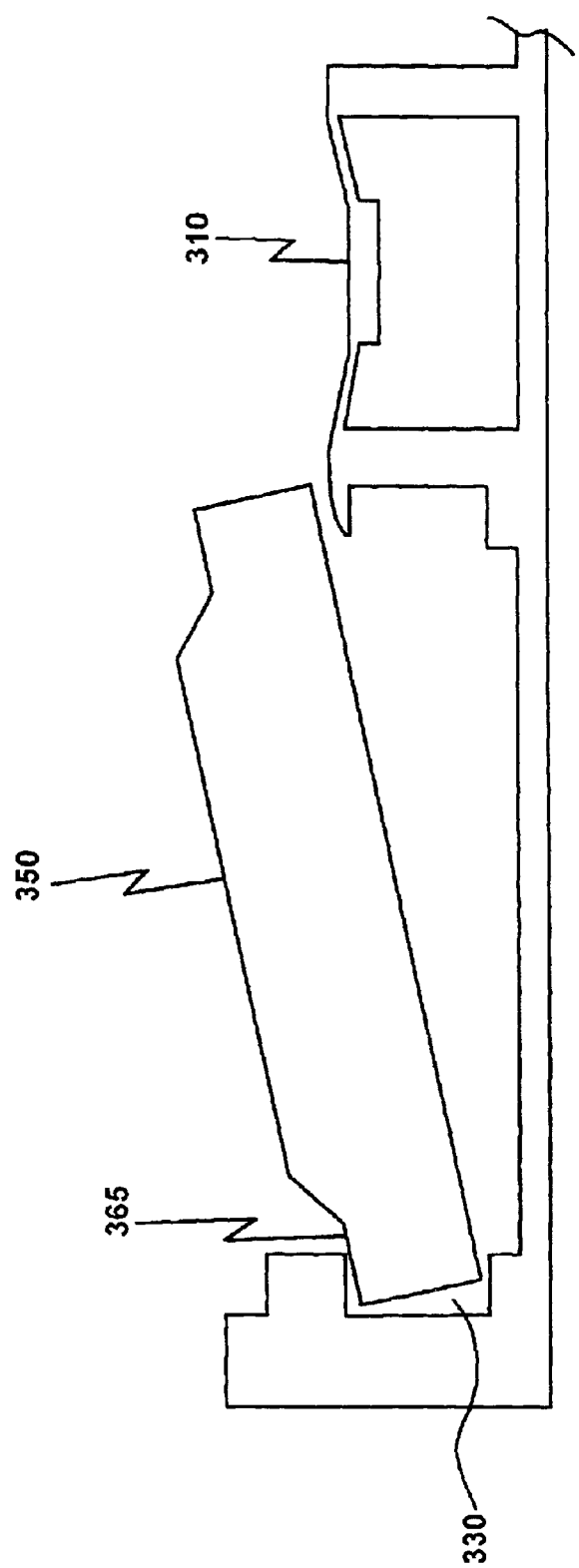
Figure 3E:
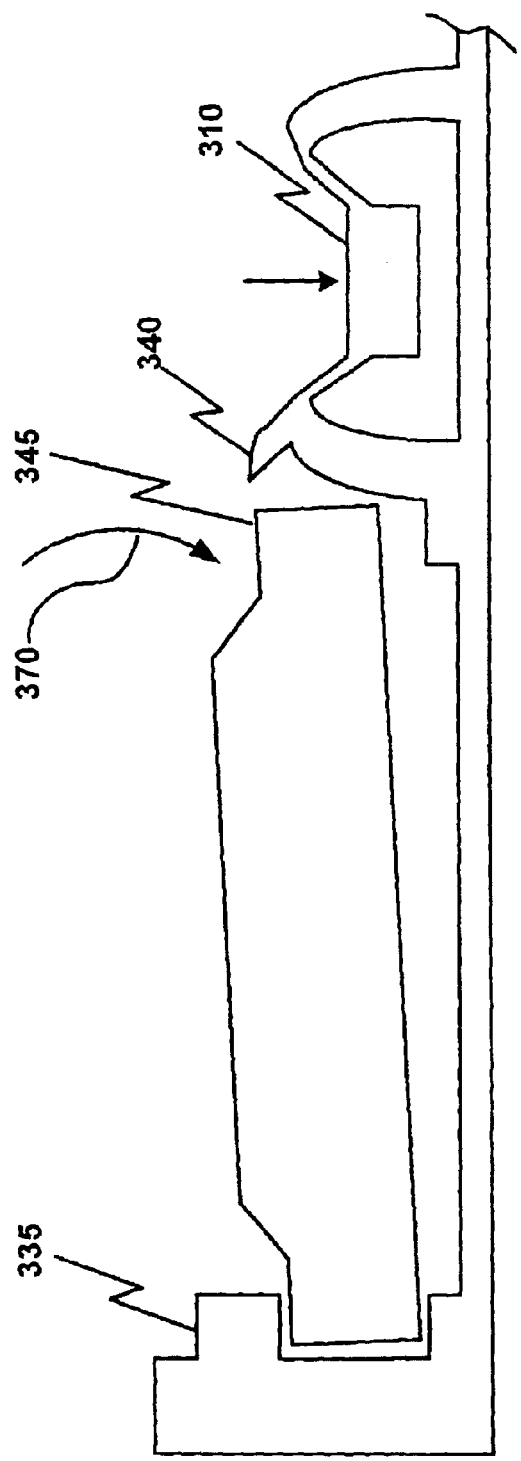
Figure 3F:
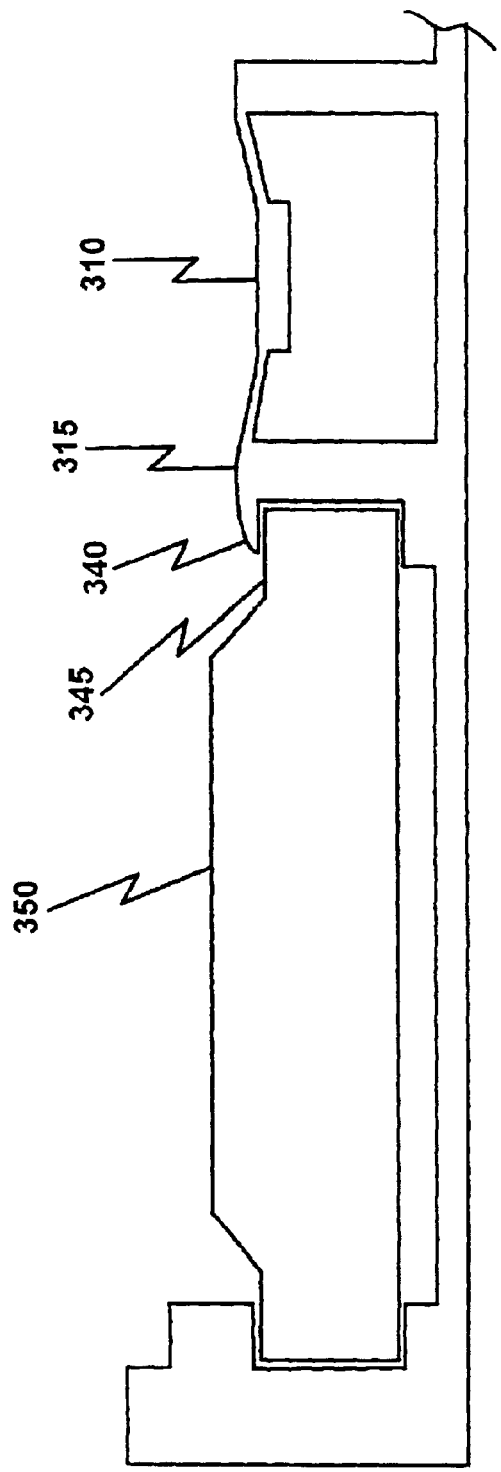

As shown in FIGS. 3D–3F, the smaller form factor device 350 can also be inserted using the release 310 mechanism. First, one edge 365 of the smaller form factor device 350 can be inserted into the slot 330 provided by the fixed retainer 335 as shown in FIG. 3D. The release 310 mechanism is then activated to allow the opposite edge 345 of the smaller form factor device to be lowered 370 bellow the catch paw 340, as shown in FIG. 3E. As shown in FIG. 3F, when the release 310 is allowed to return to its static state, the catch paw 340 on the flexible member 315 engages the associated edge 345 of the smaller form factor device 350.

Figure 4:
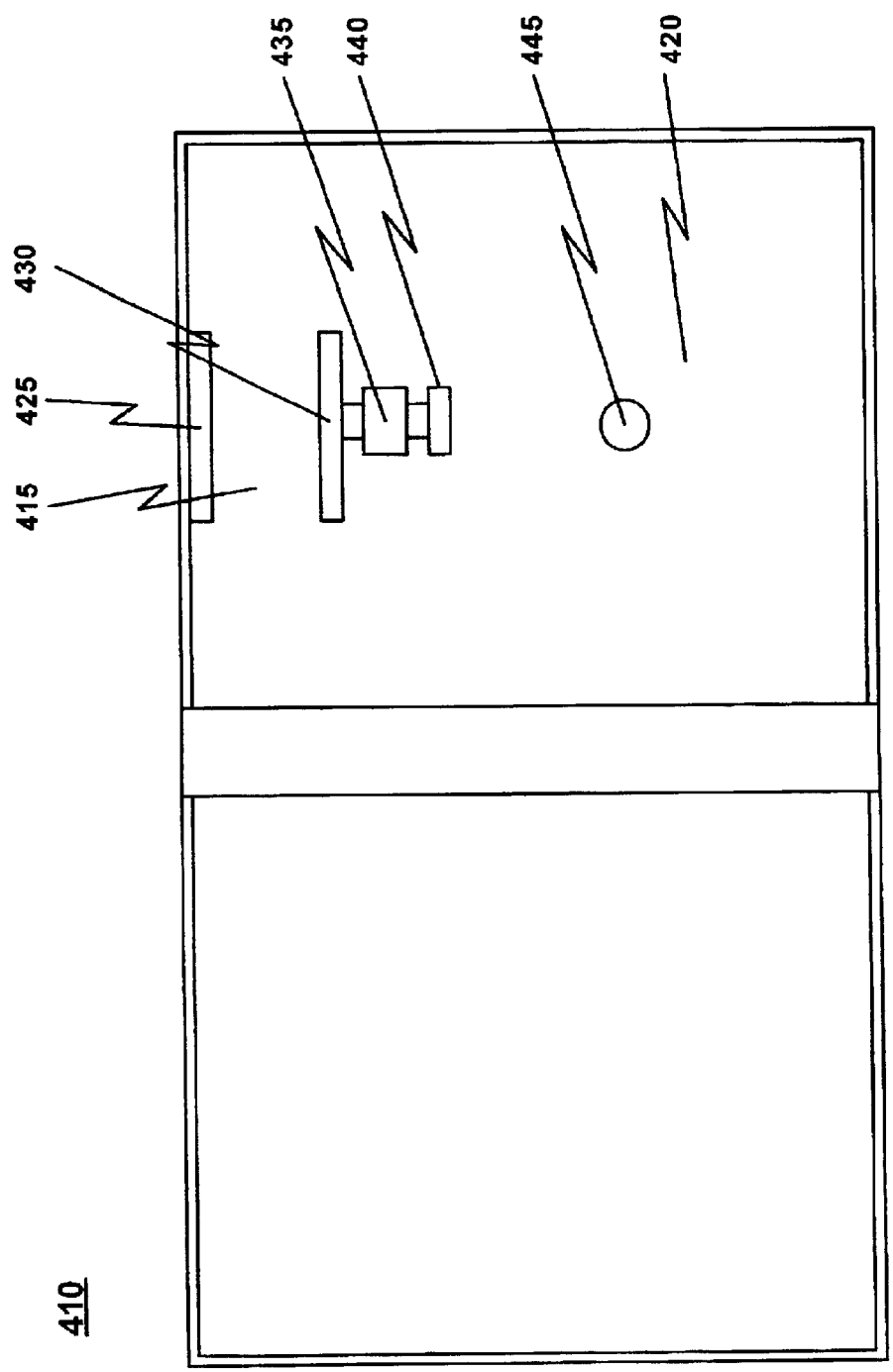
FIG. 4 shows a plain view of a package in accordance with one embodiment of the present invention.

Referring to FIG. 4, a plain view of a package 410 in accordance with one embodiment of the present invention is shown. As depicted in FIG. 4, the package 410 provides for an area 415 for holding a PC card and an area 420 for holding a CD.

In one embodiment, the fixed retainer 425 provides a slot of approximately 3.3 mm wide for accepting an edge of a PC card along its lengthwise direction. In such an embodiment the flexible retainer 430 is disposed approximately 54 mm from the fixed retainer 425. While the catch paw is located on the flexible retainer 430 at a height of approximately 3.3 mm for engaging the opposite lengthwise edge of the PC card. Thus, the embodiment is capable of accepting PC cards of varying heights, because the retainers engage the PC card along the edges, which are of a consistent thickness. Furthermore, the retainers 425 430 are spaced according to the standard PC card width, which is also consistent among the various PC cards. Therefore, the embodiment is also capable of accepting PC cards of varying lengths, because the lengthwise direction is not obstructed by any retainer 425 430.

In another implementation of the above-described embodiment, the PC card holder is also provided with a release mechanism 435. The release is coupled to the flexible retainer 430 and a member 440. Both the flexible retainer 430 and member 440 are anchored to a surface of the package. The release 435 is activated by a downward force. The downward motion of the release causes the flexible retainer 435 to flex in toward the release 440. As the flexible retainer 430 bends in toward the release 435, the catch paw on the flexible retainer 430 is drawn away from the PC card, thereby releasing the PC card. For inserting the PC card into the package, one lengthwise edge of the PC card can be inserted into the slot provided by the fixed retainer 425. The release mechanism 435 is then activated to allow the adjacent lengthwise edge of the PC card to be lowered bellow the catch paw on the flexible retainer 430. When the release 435 is allowed to return to its static state, the catch paw on the flexible retainer 430 engages the adjacent edge of the PC card, thereby securing the PC card.

The present embodiment also provides a means for holding a CD 445. The CD may be held by any number of known means for retaining CDs. For example, a substantially circular segmented lug having a plurality of retention teeth and a release button is provided. The diameter of the segmented lug is slightly smaller in size then the central opening in the CD. The retention teeth protrude from the segmented lug such that the teeth extend circumferentially wider then the central opening in the CD, thus providing the means for holding the CD about the segmented lug. The release button when depressed acts to draw the segments lug together whereby the central opening of the CD is able to clear the retention teeth, allowing the CD to be removed.

Figure 5:
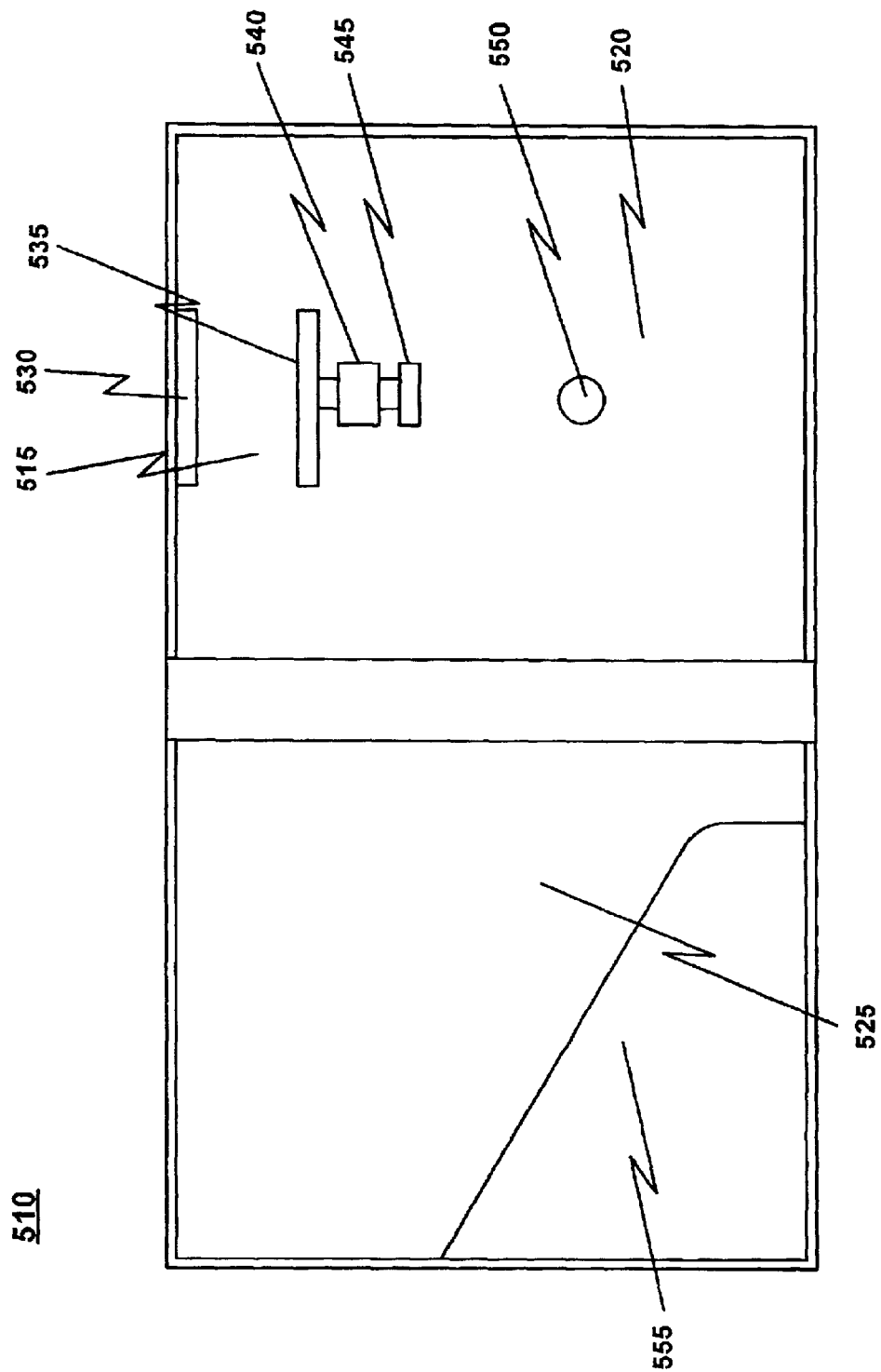
FIG. 5 shows a plain view of a package in accordance with one embodiment of the present invention.

Referring to FIG. 5, a plain view of a package 510 in accordance with one embodiment of the present invention is shown. As depicted in FIG. 5, the package 510 provides an area 515 for holding a PC card, an area 520 for holding a CD, and an area 525 for holding associated documentation.

In one embodiment, a fixed retainer 530 provides a slot of approximately 3.3 mm wide for accepting an edge of a PC card along the PC card's lengthwise direction. A flexible retainer 535 is disposed approximately 54 mm from the fixed retainer 530. While a catch paw is located on the flexible retainer 535 at a height of approximately 3.3 mm for engaging the opposite lengthwise edge of a PC card. Thus, the embodiment is capable of accepting PC cards of varying heights, because the retainers 530 535 engage the PC card along the edges, which are of a consistent thickness. Furthermore, the retainers 530 535 are spaced according to the standard PC card width, which is also consistent among the various PC cards. Therefore, the embodiment is also capable of accepting PC cards of varying lengths, because the lengthwise direction is not obstructed by any retainer.

In another embodiment of the present invention, the PC card holder is also provided with a release mechanism 540. The release 540 is coupled to the flexible retainer 535 and a member 545. Both the flexible retainer 535 and member 545 are anchored to a surface of the package. The release 540 is activated by a downward force. The downward motion of the release 540 causes the flexible retainer 535 to flex in toward the release 540. As the flexible retainer 535 bends in toward the release 540, the catch paw on the flexible retainer 535 is drawn away from the PC card, thereby releasing the PC card. For inserting the PC card into the package, one lengthwise edge of the PC card is inserted into the slot provided by the fixed retainer 530. The release 540 mechanism is then activated to allow the adjacent lengthwise edge of the PC card to be lowered bellow the catch paw on the flexible retainer 535. When the release 540 is allowed to return to its static state, the catch paw on the flexible retainer 535 engages the adjacent edge of the PC card, thereby securing the PC card.

The present embodiment also provides a means for holding 550 a CD. The CD may be held 550 in place by any number of known means for retaining CDs. For example, a substantially circular segmented lug having a plurality of retention teeth and a release button is provided. The diameter of the segmented lug is slightly smaller in size then the central opening in the CD. The retention teeth protrude from the segmented lug such that the teeth extend circumferentially wider then the central opening in the CD, thus providing the means for holding the CD about the segmented lug. The release button when depressed acts to draw the segments lug together whereby the central opening on the CD is able to clear the retention teeth, allowing the CD to be removed.

The present embodiment also provides a means for holding 525 associated documentation. The associated document may be held in place by any number of known means for retaining documents. For example, one or more vertically spaced clips can be used. The documentation is inserted laterally under the clips and held in place therein by frictional force supplied by the clips. Alternatively, a vertical, horizontal or diagonal packet 555 can be provided for holding the associated documentation.

The location for holding the PC card, CD, and or documentation can be at any location in the package. For example, the associate documentation can be held on the interior of the top fold, while the PC card and CD can be held adjacent each other on the interior of the bottom fold. However, any convenient organization, location, or the like may be chosen. Thus, it is not necessary that the PC card, CD and associated documentation be located as indicated in the drawings.

In one embodiment, the present invention is molded in one or more pieces of ESD plastic. The ESD plastic provides protection to the PC card against electrostatic discharge, which might damage the device. In another embodiment, the present invention is treated with ESD proof chemicals (i.e. chemically shielded). In yet another embodiment, the present invention does not provide protection against electrostatic discharge.

In one embodiment, the present invention provides a substantial reduction in the packaging volume. In one implementation, a reduction in volume of approximately 75% has been achieved in comparison to current PC card packaging.

In one embodiment, the present invention provides a substantial reduction in the packaging costs. In one implementation, a reduction in cost of approximately 35% has been achieved, in comparison to current PC card packaging.

Figure 6A:
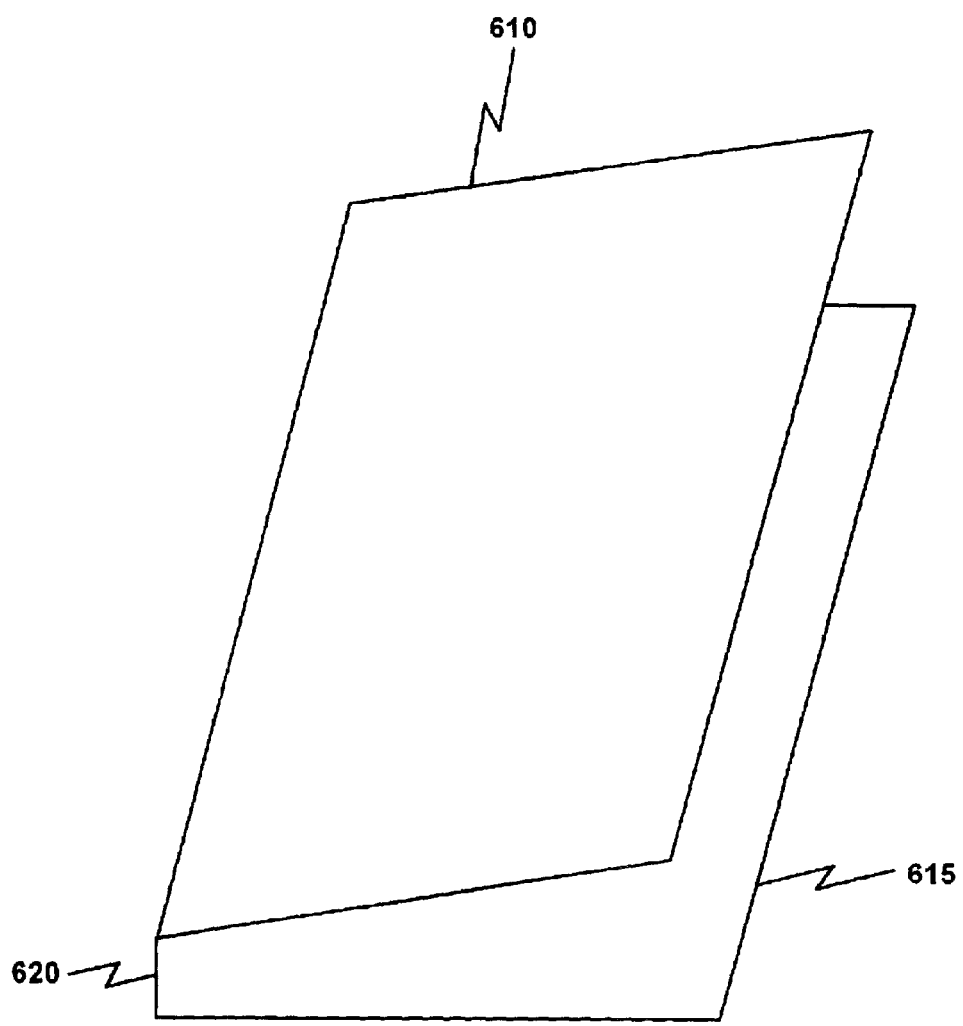
FIGS. 6A–6B show perspective views of a packaging in accordance with various embodiments of the present invention.

Referring to FIG. 6A, a perspective view of a package 600 in accordance with one embodiment of the present invention is shown. As depicted in FIG. 6A, the packaging 600 comprises a top and bottom cover 610, 615. The top and bottom covers 610, 615 are flexible connected 620 along adjacent sides, such that when the package 600 is folded the PC card, the CD and/or the associated documentation are contained within a protective enclosure defined by the top and bottom cover 610, 615.

Figure 6B:
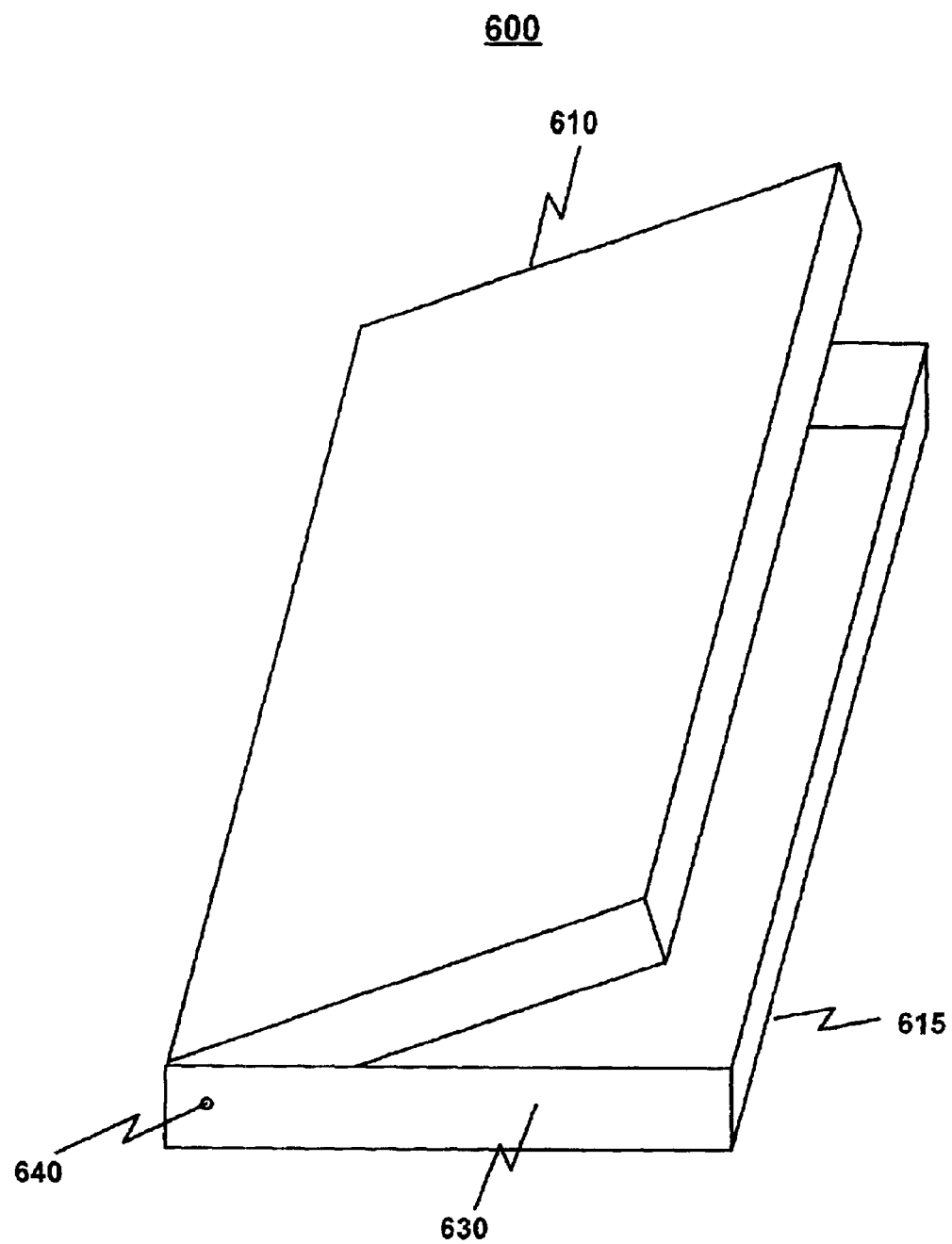

Referring to FIG. 6B, a perspective view of a package 600 in accordance with one embodiment of the present invention is shown. As depicted in FIG. 6B, the packaging 600 comprises a top and bottom cover 610, 615 and side walls 630. The top and bottom covers 610, 615 are pivotally connected 640 at adjacent oppositely disposed ends of the side walls 630, such that when the package is folded the PC card, the CD and/or the associated documentation are contained within a protective enclosure defined by the top and bottom cover 610, 615.

Figure 7:
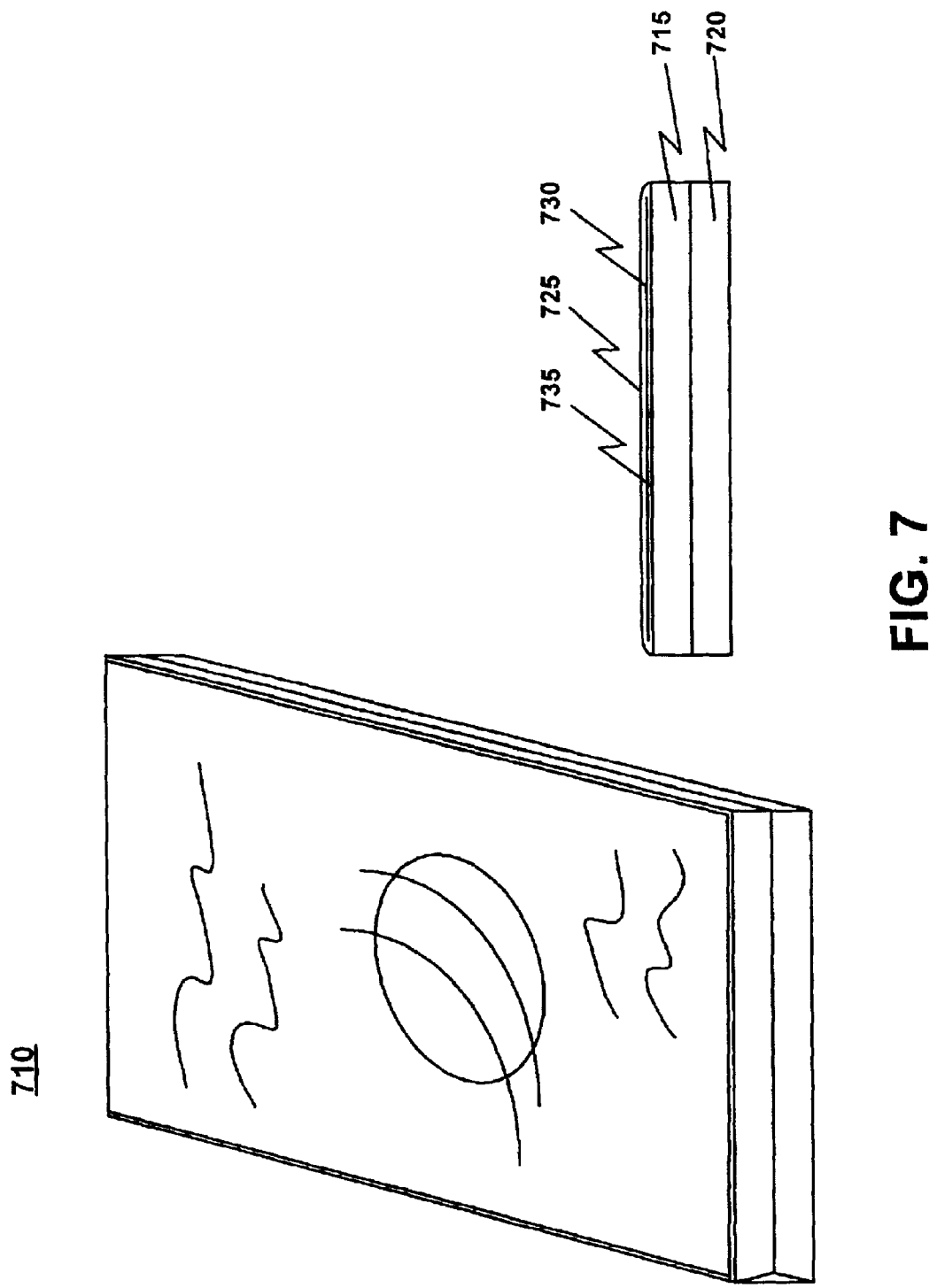
FIG. 7 shows a perspective view and side view of a packaging in accordance with one embodiment of the present invention.

Referring to FIG. 7, a perspective and side view of a package 710 in accordance with one embodiment of the present invention is shown. As depicted in FIG. 7, the exterior of a top 715 and/or bottom 720 cover is provided with a sleeve 725. The sleeve 725 is capable of accepting printed matter 730 such as product description, artwork, and the like. The sleeve 725, for example, may be a clear piece of plastic attached to an exterior surface 735 of the package 710 along three corresponding edges of the plastic and cover. The fourth edge is left unattached, thereby providing an opening for insertion of the printed matter 730. The plastic is attached to the cover of the package 710 such that friction force between the printed matter 730 and the sleeve 725 securely holds the printed matter 730 flush against the exterior of the package 735. The clear plastic provides a transparent window for display of the printed matter 730.

The sleeve 725 provides a simple means for changing printed matter 730 in response to changes in the product. The sleeve 725 also provides for reducing rework and or scrap costs, because the printed matter 730 is separate from the rest of the packaging; unlike the current method, whereby the printed matter is printed directly on or adhered to the outer cardboard box. The current method therefore requires that the cardboard box be scrapped if changes need to be made to the printed matter.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A large form factor media enclosure structure configured to removably retain a PC card device therein, said large form factor media enclosure structure comprising:
   a PC card holder, coupled to said large form factor media enclosure, comprising;
   a first retainer, wherein said first retainer is flexible;
   a second retainer sidelong oppositely disposed from said first retainer;
   a catch paw disposed along said first retainer, wherein said catch paw is adapted to frictionally engage said PC card device within said large form factor media enclosure; and
   a second holder coupled to said large form factor media enclosure; and
   wherein said PC card holder is adapted to hold one of a plurality of PC card devices, wherein a first of said plurality of PC card devices and a second of said plurality of PC card devices vary from each other in two of three overall dimensions.

2. The large form factor media enclosure structure according to claim 1, further comprising:
   a release attached to said first retainer, wherein activation of said release is adapted to cause said first retainer to flex whereby said catch paw disengages said PC card device.

3. The large form factor media enclosure structure according to claim 1, wherein said second retainer is fixed and further comprises a slot, adapted to receive an edge of said PC card device.

4. The large form factor media enclosure structure according to claim 3, wherein said slot is closed at one or more ends.

5. The large form factor media enclosure structure according to claim 1, wherein said large form factor media enclosure structure is formed as an integral plastic molding.

6. The large form factor media enclosure structure according to claim 1, wherein said large form factor media enclosure structure is adapted to protect against electrostatic discharge.

7. The large form factor media enclosure structure according to claim 1, wherein said large form factor media enclosure structure is adapted to hold one or more types of PC card devices.

8. A large form factor media enclosure structure configured to removably retain a PC card device therein, said large form factor media enclosure structure comprising:
   a flexible retainer coupled to said large form factor media enclosure structure;
   a catch paw disposed along said flexible retainer, wherein said catch paw is adapted to frictionally engage a first edge of said PC card device;
   a fixed retainer coupled to said large form factor media enclosure structure, wherein said fixed retainer is sidelong oppositely disposed from said flexible retainer;
   a slot disposed along said fixed retainer, wherein said slot is adapted to receive a second edge of said PC card device; and
   wherein said large form factor media enclosure structure is adapted to hold one of a plurality of PC card devices, wherein a first of said plurality of PC card devices and a second of said plurality of PC card devices vary from each other in two of three overall dimensions.

9. The large form factor media enclosure structure according to claim 8, further comprising:
   a release attached to said flexible retainer, wherein activation of said release is adapted to cause said flexible retainer to flex whereby said catch paw disengages said smaller form factor device.

10. The large form factor media enclosure structure according to claim 8, wherein said slot is closed at one or more ends.

11. The large form factor media enclosure structure according to claim 8, wherein said large form factor media enclosure structure is formed as an integral plastic molding.

12. The large form factor media enclosure structure according to claim 11, wherein said plastic is adapted to protect against electrostatic discharge.

13. The large form factor media enclosure structure according to claim 8, wherein said first of said plurality of PC card devices has a first overall height and said second of said plurality of PC card devices has a second overall height, and wherein said first overall height is different from said second overall height.

14. The large form factor media enclosure structure according to claim 8, wherein said first of said plurality PC card devices has a first overall length and said second of said plurality of PC card devices has a second overall length, and wherein said first overall length is different from said second overall length.

15. The large form factor media enclosure structure according to claim 8, wherein said flexible retainer and said fixed retainer are adapted to hold one of said plurality of PC card devices, wherein said first of said plurality of PC card devices and said second of said plurality of PC card devices vary from each other in two of three overall dimensions.

16. A package comprising:
   a compact disk (CD) holder disposed within said package; and
   a PC card holder disposed within said package, wherein said PC card holder comprises:
   a flexible retainer;
   a catch paw disposed along said flexible retainer, wherein said catch paw frictionally engages a first edge of a PC card;
   a fixed retainer;
   a slot disposed along said fixed retainer, wherein said slot receives a second edge of said PC card; and
   wherein said PC card holder is adapted to hold one of a plurality of PC card devices, wherein a first of said plurality of PC card devices and a second of said plurality of PC card devices vary from each other in two of three overall dimensions.

17. The package according to claim 16, wherein said PC card holder further comprises:
   a release attached to said flexible retainer, wherein activation of said release causes said flexible retainer to flex whereby said catch paw disengages said PC card.

18. The package according to claim 16, wherein said fixed retainer is formed as an integral part of a side wall of said package.

19. The package according to claim 16, further comprising:
   a documentation holder disposed within said package.

20. The package according to claim 16, further comprising:
   a sleeve attached to an exterior surface of said package, wherein said sleeve receives printed matter for display.

21. The package according to claim 16, wherein said package is formed as an integral molding.

22. The package according to claim 16, wherein said package is molded from plastic.

23. The package according to claim 22, wherein said plastic is adapted to protect said PC card against electrostatic discharge.

24. The package according to claim 16, wherein said package is adapted to hold PC cards from the group consisting of Type I PC cards, Type II PC cards, or Type III PC cards.

25. The package according to claim 16, wherein said slot is closed at one or more ends.

* * * * *